United States Patent
Kleinschmidt et al.

(10) Patent No.: US 6,894,285 B2
(45) Date of Patent: May 17, 2005

(54) ARRANGEMENT FOR MONITORING THE ENERGY RADIATED BY AN EUV RADIATION SOURCE

(75) Inventors: Juergen Kleinschmidt, Weissenfels (DE); Uwe Stamm, Goettingen (DE)

(73) Assignee: Xtreme technologies GmbH, Jena (DE)

( * ) Notice: Subject to any disclaimer, the term of this patent is extended or adjusted under 35 U.S.C. 154(b) by 157 days.

(21) Appl. No.: 10/357,899

(22) Filed: Feb. 4, 2003

(65) Prior Publication Data

US 2003/0146391 A1 Aug. 7, 2003

(30) Foreign Application Priority Data

Feb. 5, 2002 (DE) .......................................... 102 04 994

(51) Int. Cl.[7] .............................................. G03B 27/72
(52) U.S. Cl. .......................................... 250/372; 355/35
(58) Field of Search ........................... 250/372, 492.22, 250/503, 504 R; 355/35, 53, 67, 68, 69, 77, 133; 255/35, 53, 67, 68, 69, 77, 133

(56) References Cited

U.S. PATENT DOCUMENTS

| | | | | |
|---|---|---|---|---|
| 6,252,650 B1 * | 6/2001 | Nakamura | .................... | 355/69 |
| 6,542,222 B1 * | 4/2003 | Tsuji et al. | .................... | 355/67 |
| 6,603,533 B2 * | 8/2003 | Go | .................... | 355/71 |
| 6,744,060 B2 * | 6/2004 | Ness et al. | .............. | 250/504 R |
| 2001/0048083 A1 * | 12/2001 | Hagiwara | .............. | 250/492.22 |
| 2003/0058429 A1 * | 3/2003 | Schriever | ..................... | 355/133 |
| 2003/0098959 A1 * | 5/2003 | Hagiwara et al. | ............. | 355/69 |

OTHER PUBLICATIONS

M. Antoni et al., "Illumination optic design for EUV Lithography", *Proc. of SPIE*, vol. 4146, Aug. 2000.

* cited by examiner

*Primary Examiner*—Otilia Gabor
(74) *Attorney, Agent, or Firm*—Reed Smith LLP

(57) ABSTRACT

The invention is directed to an arrangement for monitoring the energy radiated by an EUV radiation source with respect to energy variations acting in an illumination beam path, wherein the radiation source has a plasma column emitting extreme ultraviolet radiation. The arrangement includes an energy monitoring unit, and a detection beam path. The detection beam path is separate from the illumination beam path and is arranged with the energy monitoring unit for detecting pulse energy, so that the illumination beam path is not impaired by the energy measurement. The detection beam path is matched to the illumination beam path with respect to bundle extension and optical losses.

13 Claims, 2 Drawing Sheets

ARRANGEMENT FOR MONITORING THE ENERGY RADIATED BY AN EUV RADIATION SOURCE

CROSS-REFERENCE TO RELATED APPLICATIONS

This application claims priority of German Application No. 102 04 994.7, filed Feb. 5, 2002, the complete disclosure of which is hereby incorporated by reference.

BACKGROUND OF THE INVENTION a) Field of the Invention

The invention is directed to an arrangement for monitoring the energy radiated by an EUV radiation source with respect to the energy variations taking place in an illumination beam path, particularly for controlling dose stability in EUV lithography for chip fabrication in semiconductor technology.

b) Description of the Prior Art

In addition to special lamps, narrow-band excimer lasers with wavelengths of 248 nm and 193 nm are currently used as radiation sources for producing microchips. Scanners based on $F_2$ lasers (157 nm) are in development at this time.

In all photolithography processes, a mask (containing the structure to be imaged) is imaged on a wafer (semiconductor disk) in the scanner in a reduced manner (the reduction is typically 1:5). EUV radiation sources (around 13.5 nm) appear to be the most promising of the various solutions for the next generation of semiconductor lithography. Aside from the characteristics of the optical system (numerical aperture, depth of focus, aberrations or imaging errors of the lenses or mirrors), the image quality of the photolithographic process is essentially determined by how accurately the radiated radiation dose (dose accuracy) can be maintained. This dose stability is determined by:

a) pulse quantization
b) pulse-to-pulse stability
c) spatial stability of the emitting volume.

Pulse quantization is scanner-specific. The quantity of light pulses that can fall into a moving slit during the scan varies. However, this quantity can usually be ignored.

The quantities b and c are specific to the EUV radiation source itself. An arrangement which prevents the spatial fluctuations of the emitting region or suitably takes them into account would be useful for regulating pulse energy.

The throughput of a photolithography scanner (throughput=quantity of wafers exposed per time unit) is essentially determined by the pulse energy and the pulse repetition frequency of the radiation source as well as by optical losses in the scanner itself. Optical losses occur due to the limited reflectivity of the collector and mirrors and due to so-called geometric losses. The amount of radiation output that can be caught by the collector optics is defined by a quantity specific to the radiation source, the so-called source etendue (the magnitude of the emitting region [$mm^2$] times the usable solid angle [sr]). Strictly speaking, the etendue is determined by the total geometry of the radiation source, by the dimension of the source location, by any exit windows and by the aperture of the optics following it. The etendue quantity also determines how much radiation can be detected by an optical system arranged after it. Further, the etendue represents a measurement of the radiation losses given by the geometric ratios of the radiation source (geometric losses).

To prevent geometric losses, the source etendue may not be greater than the etendue of the imaging system in the scanner, as is described in M. Antoni et al., "Illumination optic design for EUV Lithography", *Proc. of SPIE,* Vol. 4146, August 2000). If this condition can be met, the radiation output in the wafer plane is now only dependent on the reflectivity of all mirrors. Regulation of the pulse energy would require detection of this pulse energy through constant measurement (monitoring) by a radiation detector.

However, the scanner optics require an isotropic radiation characteristic with respect to angular distribution. Therefore, mirror optics which couple out light are not desired in the illumination beam path for coupling out at least a part of the radiation to an energy detector. For this reason, previously known EUV radiation sources are usually operated without regulation because measurements impair the energy flux during operation.

OBJECT AND SUMMARY OF THE INVENTION

It is the primary object of the invention to find a novel possibility for detecting variations in the radiation emitted by EUV sources which allows fluctuations in pulse energy as well as spatial fluctuations acting in the illumination beam path to be detected.

In an arrangement for monitoring the energy radiated by an EUV radiation source with respect to energy variations acting in an illumination beam path, wherein the radiation source has a plasma column emitting extreme ultraviolet radiation, the object is met according to the invention in that a detection beam path is separated from the illumination beam path with respect to the plasma column and has an energy monitoring unit for measuring pulse energy, so that the illumination beam path is not impaired by the energy measurement, and the detection beam path is matched to the illumination beam path with respect to bundle extension and optical losses.

The detection beam path is advantageously arranged opposite to the illumination beam path with respect to the plasma column. The two separate beam paths are advisably adapted to one another in that the etendue of the detection beam path is matched to the aperture of the first collector optics of the illumination beam path by means of a shutter or diaphragm with a defined aperture. It is advantageous when the aperture of the diaphragm is adjustable.

All filters required in the illumination beam path are advantageously arranged in the detection beam path in the same manner and in the same quantity. These filters are preferably debris filters and filters for achieving spectral purity of radiation (spectral filters).

The energy monitoring unit can be realized in different ways. In a first variant, it can be designed so as to have an energy detector, which is arranged with its light-sensitive surface completely within the light bundle transmitted by the reflection optics of the detection beam path, and a second detector whose light-sensitive surface is only partially illuminated by the edge area of the light bundle of the detection beam path, so that variations in the position of the light bundle due to fluctuations in the spatial distribution of the emitted EUV radiation are quantifiable. For this purpose, a substantial central portion of the light bundle is advisably deflected to the energy detector by means of a plane mirror, this energy detector being arranged along the bent optical axis of the reflection optics. The etendue of the illumination beam path is accordingly simulated in the detection beam path by means of an aperture stop and the effective surface of the plane mirror, and the energy detector registers the effect of an energy fluctuation on the target object (wafer) in the illumination beam path. Due to the spatial fluctuations of the plasma column, proportions of the radiation can travel past the mirror and therefore miss the energy detector and be detected by the second detector behind the mirror as a total spatial radiation variation.

The mirror is preferably a multilayer mirror which deflects the light bundle orthogonal to the axis of the reflection optics, but can also be a metal mirror with grazing incidence.

Another design possibility for the energy detector unit advantageously comprises a position-sensitive receiver for simultaneous detection of variations in the total pulse energy and spatial distribution of the emitted EUV radiation, wherein the total pulse energy can be determined by summing and the spatial distribution can be determined by centroid calculation from different segments of the receiver. The position-sensitive receiver is preferably a quadrant diode.

The special problem which consists in that the isotropic radiation characteristic of the illumination beam path is additionally disrupted as a result of the energy being coupled out for this measurement task is avoided, according to the invention, in that the detection beam path is arranged separate from (preferably opposite to) the illumination beam path with respect to the plasma column, and all of the ratios of the input aperture and optical losses of the illumination beam path are transferred to the detection beam path. The EUV source etendue of the illumination beam path is simulated by a defined diaphragm in front of the reflection optics of the detection beam path. The fluctuations in EUV emission can accordingly be detected by suitable detector arrangements with respect to total pulse energy and with respect to spatial changes as if they were measured in the wafer plane of the illumination beam path.

The arrangement according to the invention makes it possible to detect variations in the radiation emitted by EUV sources for purposes of regulating the latter so that it is possible to detect fluctuations in the pulse energy as well as spatial fluctuations acting in the illumination beam path without interfering with the illumination beam path.

The invention will be described more fully in the following with reference to embodiment examples.

DESCRIPTION OF THE PREFERRED EMBODIMENTS

Figure 1:
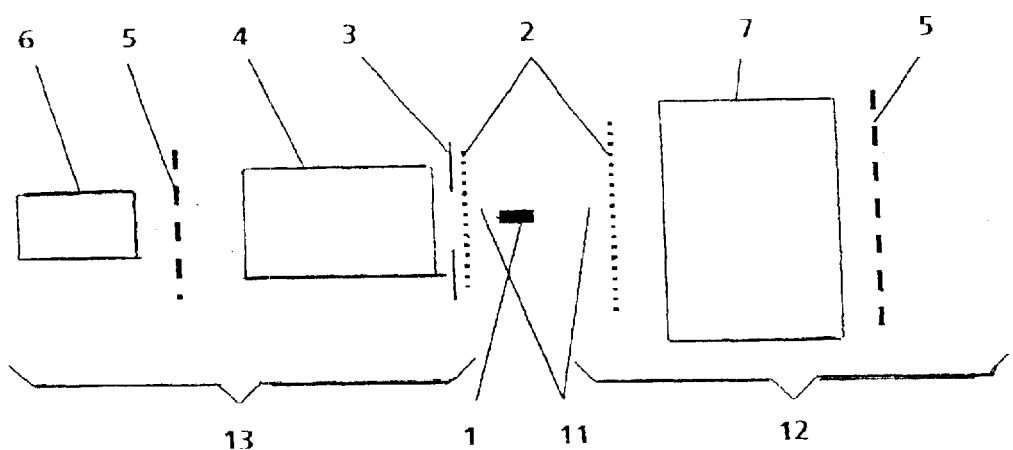
FIG. 1 is a schematic view of the invention with a separate detection beam path arranged opposite to the illumination beam path.

In a basic arrangement of an EUV source in which a hot plasma column 1 is generated in an optional manner, the invention comprises, on the one hand, an illumination beam path 12 with collector optics 7 collecting EUV radiation emitted from the plasma column 1 and transmitting it for transfer to a location of use (e.g., a scanner for semiconductor lithography, not shown) and, on the other hand, a detection beam path 13 with an energy monitoring unit 6 to which the emitted EUV radiation 11 is directed by reflection optics 4.

FIG. 1 shows a simplified overview of the invention, wherein the plasma column 1 is generated, for example, by a gas-discharge pumped EUV source, e.g., with Z-pinch (not shown). However, the plasma column 1 can also be generated by laser radiation.

As is illustrated in FIG. 1, the light path to the scanner (referred to above as illumination beam path 12) is opened, according to the invention, to all elements for monitoring the emitted EUV radiation 11 in that the light path to the energy monitoring unit 6 (detection beam path 13) is coupled out of the EUV radiation 11 of the plasma column 1 in the direction opposite to the illumination beam path 12. For reasons pertaining to the symmetry of the plasma column 1, this is particularly advantageous, but is not compulsory.

The EUV radiation 11 exiting from the plasma column 1 to the left-hand side of FIG. 1 is imaged on the energy monitoring unit 6 in the detection beam path 13 by means of reflection optics 4.

Errors occurring as a result of different out-coupling points and out-coupling optics during monitoring of the plasma function can be compensated by suitable adapting steps. This is carried out by means of the aperture of a diaphragm 3 by altering the etendue in front of the reflection optics 4 to adapt the detection beam path 13 so as to be analogous to the predetermined aperture of the collector optics 7 of an application device (e.g., a scanner, mentioned above) in the illumination beam path 12. As a result, the light paths of the detection beam path 13 and the illumination beam path 12 are identical with respect to geometric losses. This equality must also be reflected in all of the other elements in the detection beam path 13 in relation to the illumination beam path 12. Debris filters 2 contained therein, for example, must be adapted in quantity and construction in the same way as all selective spectral filters 5 in both beam paths 12 and 13.

Fluctuations in pulse energy in the wafer plane are undesirable in semiconductor lithography by reason of the required exposure accuracy. However, in EUV emission, such fluctuations are caused by the fluctuation of energy in the plasma column 1 and—because of the limited aperture of the collector optics 7—by fluctuations in the position and angle of the emitted EUV radiation 11.

By matching the etendues of the detection beam path 13 and illumination beam path 12, the arrangement shown in FIG. 1 achieves the effect whereby an energy detector in the energy monitoring unit 6 measures the same energy fluctuations that would be measured in the wafer plane.

Figure 2:
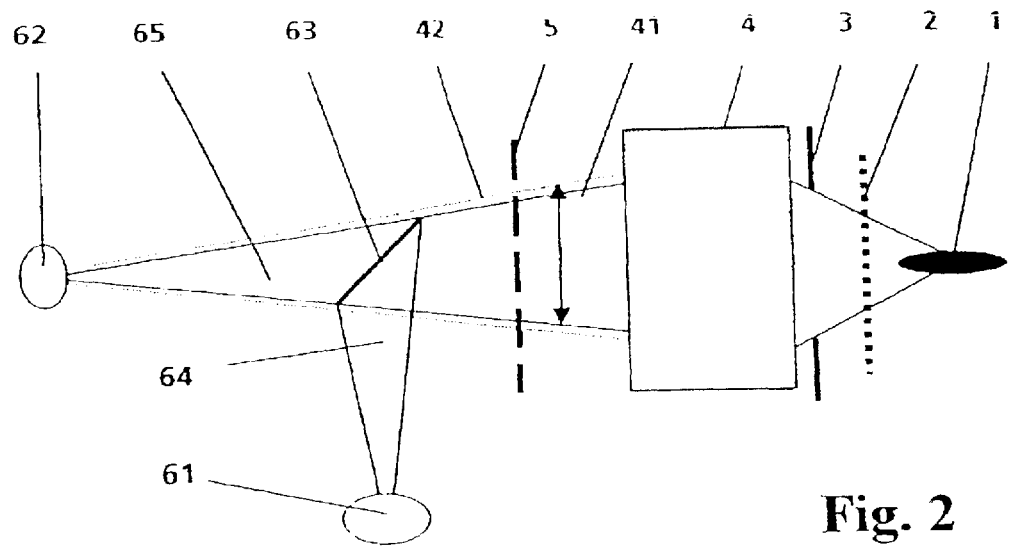
FIG. 2 shows an arrangement of the invention with two detectors for separate recording of variations in total pulse energy.

FIG. 2 shows an advantageous arrangement of the detection beam path 13 by which two different contributions to the total pulse energy fluctuation (pulse energy fluctuation and variations in the spatial distribution of the EUV emission) can be measured separately. For this purpose, the energy monitoring unit 6 has an energy detector 61 and a second detector 62, and the light bundle 41 transmitted by the reflection optics 4 is deflected onto the energy detector 61 by means of a mirror 63. Debris filters 2 and spectral filters 5 are arranged in front of and behind the reflection optics 4, respectively, analogous to the illumination beam path 12 as is described in FIG. 1. The desired etendue of the illumination beam path 12 is determined in the detection beam path 13 by the aperture of diaphragm 3 and by the effective surface of the mirror 3. The numerical aperture of the collector optics 7 of the illumination beam path 12 (shown only in FIG. 1) is simulated by the diaphragm 3.

The mirror 3 which can be a multilayer mirror or a metal mirror with grazing incidence reflects the substantial proportion of the light bundle 41. This portion of the light bundle 41 which is shown in FIG. 2 by a solid line corresponds to the ideal etendue of the illumination beam path 12 for optimal illumination of the target object (wafer).

Figure 4:
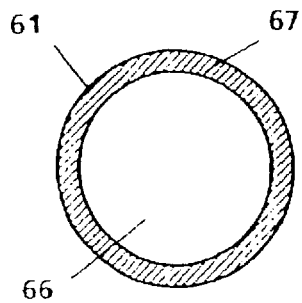
FIG. 4 shows a schematic snapshot of a radiation pattern striking the second detector 62.

FIG. 4 shows schematically the ratios of the illumination of the energy detector 61. The light spot 66 embodies the proportion of the light bundle 41 that is coupled out by the mirror 63. The energy detector 61 accordingly detects the total pulse energy and its pulse-to-pulse variations analogous to the pulse energy at the location of a wafer (not shown) in the illumination beam path 12. The imaged light spot 66 of the light bundle 41 deflected by the mirror 63 should not completely fill the light-sensitive surface 67 of the energy detector 61.

Spatial fluctuations in the plasma column 1 lead to a fluctuating bundle edge 42 (shown in dashes) of the light bundle 41 when transmitted by the diaphragm 3 and reflection optics 4. This fluctuating bundle edge 42 misses the mirror 3. Therefore, a proportion of the light bundle 41 which has wandered out in this manner does not strike the energy detector 61 and, with the emitted EUV radiation 11 of the plasma column 1 remaining the same per se, leads to a reduction in the pulse energy in the wafer plane of the illumination beam path 12 that is simulated in the detection beam path 13 through the location of the energy detector 61.

The second detector 62 is provided for the purpose of receiving this proportion of the radiation of the fluctuating bundle edge 42 and for subsequently determining from this the actual total pulse energy and the spatial variations in the emitted EUV radiation 11 separately.

Figure 3:
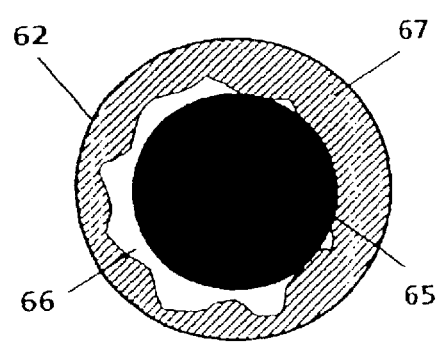
FIG. 3 is a schematic view of the radiation pattern striking the energy detector 61.

FIG. 3 shows a schematic snapshot of the light passing the mirror 63 in the form of the fluctuating bundle edge 42. The light-sensitive surface 67 of the second detector 62 is arranged in such a way that the detector 62 securely detects the "wandering" light spot 66 caused by the fluctuating bundle edge 42. The black circle in the center represents the cutout bundle core 65 whose light component was completely coupled out by the mirror 63 on the energy detector 61 (light spot 66 shown in white in FIG. 4).

Figure 5:
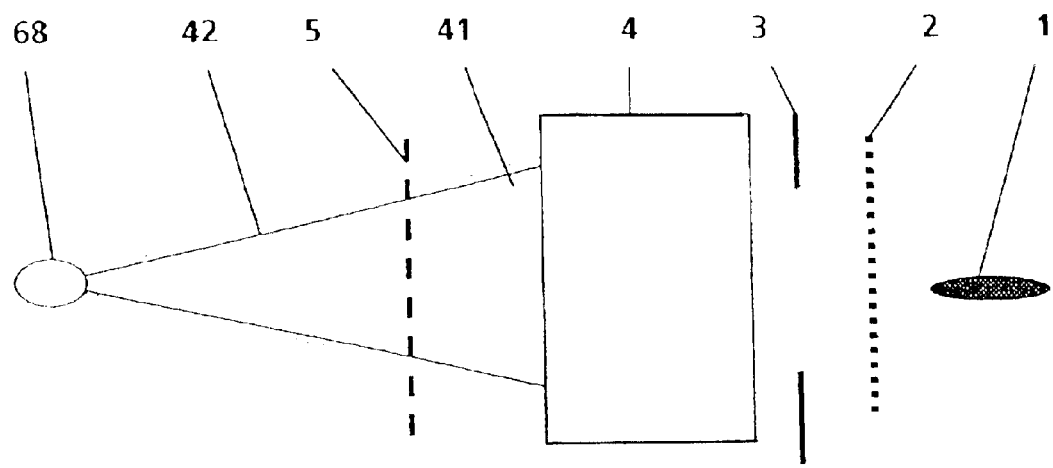
FIG. 5 shows an advantageous implementation of the invention for separating the pulse energy variations from the total pulse energy variations.

FIG. 5 shows another arrangement of the detection beam path 13. In this example, the energy monitoring unit 6 contains only one detector for detecting the total pulse energy variations as well as for detecting fluctuations in position and direction of the emitted EUV radiation 11. This detector is a position-sensitive receiver 68, e.g., a quadrant diode, and is arranged behind the reflection optics 4 along its optical axis. The light bundle 41 exiting from the reflection optics 4 must be so dimensioned in relation to the light-sensitive surface 64 that it shows the small detail illustration shown in FIG. 6. In order to prevent corrupted signals, the light spot 66 can not be permitted to wander out beyond the edge of the position-sensitive receiver 68 even with maximum dimensions of the fluctuating bundle edge 42 (according to FIG. 5).

Figure 6:
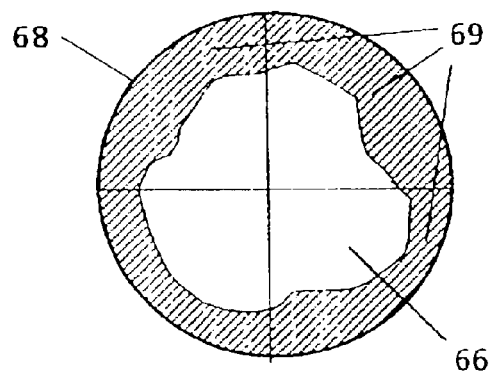
FIG. 6 is a schematic snapshot of a radiation pattern striking a quadrant detector.

FIG. 6 shows a snapshot of the incident light bundle 41, including a fluctuating bundle edge 42, so that the light spot 66 occupies an irregular and asymmetrical position on the quadrants 69 of the position-sensitive receiver 68.

In this type of energy monitoring, the sum of the energy contributed by all four quadrants 69 of the receiver 68 gives the total pulse energy and the relative contributions of the individual quadrants 69 gives information about the centroid of the spatial distribution of the radiation emission.

There are other possible design variants within the framework of the invention. The examples described above are directed to an energy monitoring unit 6 involving at least the detection of the total pulse energy and of variations in the position and angular position of the EUV radiation 11 emitted from the plasma column 1. Any other sensor principles not expressly mentioned are also to be clearly understood as belonging to the inventive teaching insofar as they can be arranged without inventive activity in a similar separate detection beam path 13 which is adapted to the aperture ratios and geometric ratios of an illumination beam path 12 which is to be maintained constant (e.g., for achieving an isotropic radiation characteristic for the dose stability in EUV lithography).

While the foregoing description and drawings represent the present invention, it will be obvious to those skilled in the art that various changes may be made therein without departing from the true spirit and scope of the present invention.

Reference Numbers
1 plasma column
11 EUV radiation
12 illumination beam path
13 detection beam path
2 debris filter
3 diaphragm
4 reflection optics
41 ideal light bundle
42 fluctuating bundle edge
5 spectral filter
6 energy monitoring unit
61 energy detector
62 second detector
63 (plane) mirror
64 reflected bundle
65 cutout bundle core
66 light spot
67 light-sensitive surface
68 position-sensitive receiver
7 collector optics

What is claimed is:

1. An arrangement for monitoring the energy radiated by an EUV radiation source with respect to energy variations acting in an illumination beam path, wherein the radiation source has a plasma column emitting extreme ultraviolet radiation, comprising:

an energy monitoring unit;

a detection beam path which is separate from the illumination beam path being arranged with said energy monitoring unit for detecting pulse energy, so that the illumination beam path is not impaired by the energy measurement; and wherein the detection beam path is matched to the illumination beam path with respect to bundle extension and optical losses.

2. The arrangement according to claim 1, wherein the detection beam path is arranged opposite to the illumination beam path with respect to the plasma column.

3. The arrangement according to claim 1, wherein the illumination beam path comprises a first collector optics having a given aperture and the detection beam path having an etendue that is matched to the given aperture of the first collector optics by a diaphragm with a defined aperture.

4. The arrangement according to claim 3, wherein the aperture of the diaphragm is adjustable.

5. The arrangement according to claim 3, wherein all filters required in the illumination beam path are arranged in the detection beam path in an equivalent manner.

6. The arrangement according to claim 5, wherein the same debris filters are present in the illumination beam path and detection beam path.

7. The arrangement according to claim 5, wherein the same spectral filters are present in the illumination beam path and detection beam path.

8. The arrangement according to claim 1, wherein the energy monitoring unit has an energy detector, which is arranged with its light-sensitive surface completely within the detection beam path having a light bundle that is transmitted by a reflection optics and a second detector whose light-sensitive surface is only partially illuminated by a border area of the light bundle of the detection beam path, so that variations in the position of the light bundle due to fluctuations in the spatial distribution of the emitted EUV radiation are quantifiable.

9. The arrangement according to claim 8, wherein a substantial central portion of the light bundle is deflected to the energy detector by a plane mirror, and the energy detector is arranged along the bent optical axis of the light bundle emanating from the reflection optics.

10. The arrangement according to claim 9, wherein the plane mirror is a multilayer mirror which deflects the light bundle orthogonal to the axis of the reflection optics.

11. The arrangement according to claim 9, wherein the plane mirror is a metal mirror with grazing incidence.

12. The arrangement according to claim 1, wherein the energy monitoring unit comprises a position-sensitive receiver having different segments for simultaneous detection of the total pulse energy and variations in the spatial distribution of the emitted EUV radiation, wherein the total pulse energy is determined by summing and changes in the spatial distribution is determined by centroid calculation from different segments of said position-sensitive receiver.

13. The arrangement according to claim 12, wherein the position-sensitive receiver is a quadrant diode.

* * * * *

UNITED STATES PATENT AND TRADEMARK OFFICE
CERTIFICATE OF CORRECTION

PATENT NO.      : 6,894,285 B2
DATED           : May 19, 2005
INVENTOR(S)     : Juergen Kleinschmidt et al.

It is certified that error appears in the above-identified patent and that said Letters Patent is hereby corrected as shown below:

<u>Title page,</u>
Item [73], Assignee, should read -- XTREME technologies GmbH, Jena (DE) --.

Signed and Sealed this

Twentieth Day of September, 2005

JON W. DUDAS
*Director of the United States Patent and Trademark Office*

UNITED STATES PATENT AND TRADEMARK OFFICE
CERTIFICATE OF CORRECTION

| | |
|---|---|
| PATENT NO. | : 6,894,285 B2 |
| APPLICATION NO. | : 10/357899 |
| DATED | : May 17, 2005 |
| INVENTOR(S) | : Juergen Kleinschmidt et al. |

It is certified that error appears in the above-identified patent and that said Letters Patent is hereby corrected as shown below:

<u>Title page,</u>
Item [73], Assignee, should read -- XTREME technologies GmbH, Jena (DE) --.

This certificate supersedes Certificate of Correction issued September 20, 2005.

Signed and Sealed this

Tenth Day of July, 2007

JON W. DUDAS
*Director of the United States Patent and Trademark Office*